(12) United States Patent
Zhao et al.

(10) Patent No.: US 7,929,309 B2
(45) Date of Patent: Apr. 19, 2011

(54) HEAT SINK ASSEMBLY HAVING CLIP

(75) Inventors: Pin-Qun Zhao, Shenzhen (CN); Dong-Bo Zheng, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/632,768

(22) Filed: Dec. 7, 2009

(65) Prior Publication Data

US 2011/0032680 A1 Feb. 10, 2011

(30) Foreign Application Priority Data

Aug. 6, 2009 (CN) .......................... 2009 10 305307

(51) Int. Cl.
*H05K 7/20* (2006.01)
(52) U.S. Cl. ................... 361/719; 361/679.54; 361/704; 361/709; 361/710; 165/80.2; 165/80.3; 165/104.33; 165/185; 257/707; 257/713; 257/718; 257/719; 257/727; 174/252
(58) Field of Classification Search ............ 361/679.46, 361/679.49, 679.54, 702–712, 717–727, 361/732, 753, 796; 165/80.2, 80.3, 80.4, 165/80.5, 104.32, 104.33, 104.34, 185; 257/706–727; 174/15.1, 16.3, 252; 24/295, 24/296, 457, 458, 495, 517, 546, 573, 625, 24/581, 589, 981; 248/505, 506, 510, 316.7; 411/511, 516, 522, 530, 523; 29/890.02, 890.03, 592.1, 832
See application file for complete search history.

(56) References Cited

U.S. PATENT DOCUMENTS

| | | | |
|---|---|---|---|
| 6,201,697 B1 * | 3/2001 | McCullough | 361/704 |
| 6,646,881 B1 * | 11/2003 | Lai et al. | 361/719 |
| 6,822,864 B2 * | 11/2004 | Huang et al. | 361/697 |
| 6,898,083 B1 * | 5/2005 | Hornung | 361/704 |
| 6,948,554 B2 * | 9/2005 | Lee et al. | 165/80.3 |
| 6,988,871 B2 * | 1/2006 | Deboer et al. | 415/176 |
| 7,133,288 B2 * | 11/2006 | DelPrete et al. | 361/719 |
| 7,327,575 B2 * | 2/2008 | Yu et al. | 361/719 |
| 7,564,686 B2 * | 7/2009 | Wang et al. | 361/700 |

* cited by examiner

*Primary Examiner* — Michael V Datskovskiy
(74) *Attorney, Agent, or Firm* — Frank R. Niranjan

(57) ABSTRACT

A clip is adapted for securing a heat sink on a printed circuit board (PCB). The clip includes a linking portion, an operating portion, a handle, and a pressing portion. The linking portion is located at a lateral side of the heat sink. The operating portion pivotally engages with the linking portion and the heat sink. The handle connects the operating portion. The pressing portion connects the linking portion. A fastener mounted on the PCB extends through the heat sink and the pressing portion. The pressing portion is slidable from a first position to a second position. When the pressing portion is in the second position the handle is operable to drive the operating portion to move upwardly and urge the pressing portion to move along the fastener until the pressing portion abuts against a top portion of the fastener and simultaneously presses the heat sink.

19 Claims, 5 Drawing Sheets

HEAT SINK ASSEMBLY HAVING CLIP

BACKGROUND

1. Technical Field

The present invention relates to a heat sink assembly having a clip, which can easily and accurately attach a heat sink to a printed circuit board.

2. Description of Related Art

A typical heat sink assembly cools an electronic component mounted on a printed circuit board (PCB). The heat sink assembly generally includes a heat sink contacting the electronic component to facilitate dissipation of heat therefrom, and a clip fastening the heat sink to the electronic device. The clip comprises a pressing portion, and a plurality of hooks extending from a periphery of the pressing portion. The pressing portion presses the heat sink. The hooks are engaged with engaging portions of the PCB one by one using a mounting tool, to mount the heat sink on the PCB. This is very time-consuming and troublesome.

What is needed, therefore, is a heat sink assembly having a clip, wherein the clip can easily and accurately attach a heat sink to a printed circuit board.

DETAILED DESCRIPTION

Figure 1:
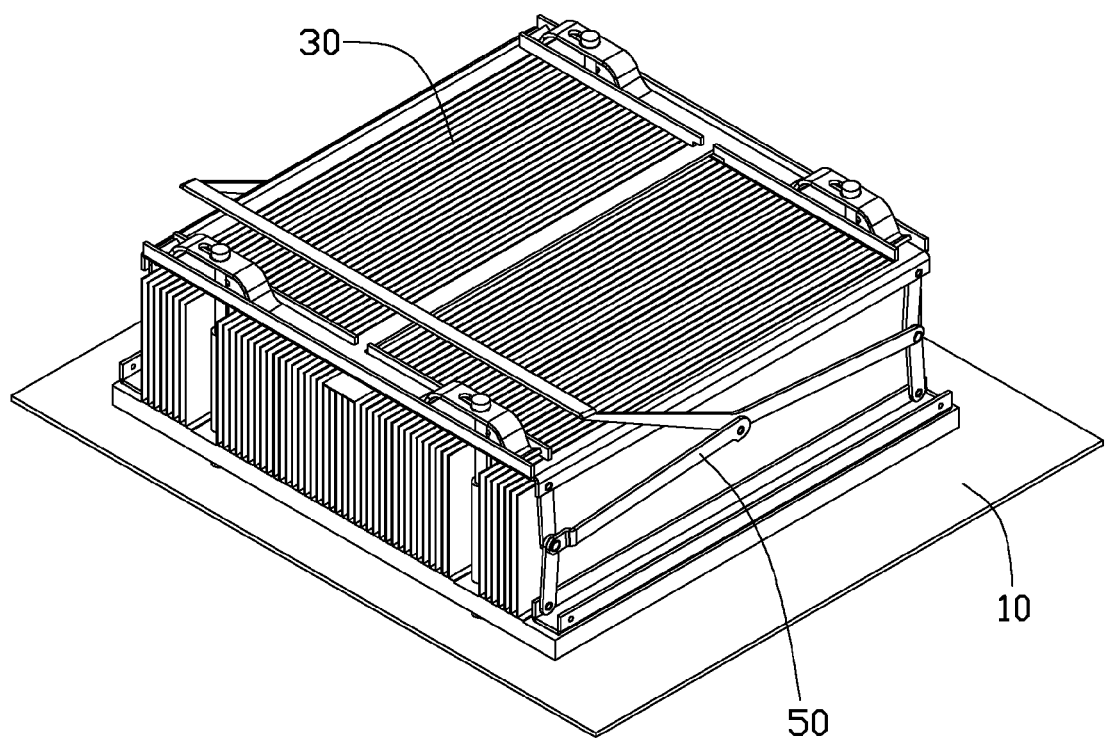
FIG. 1 is an assembled view of a heat sink assembly in accordance with an embodiment of the present disclosure, showing a clip of the heat sink assembly unlocked.
Figure 2:
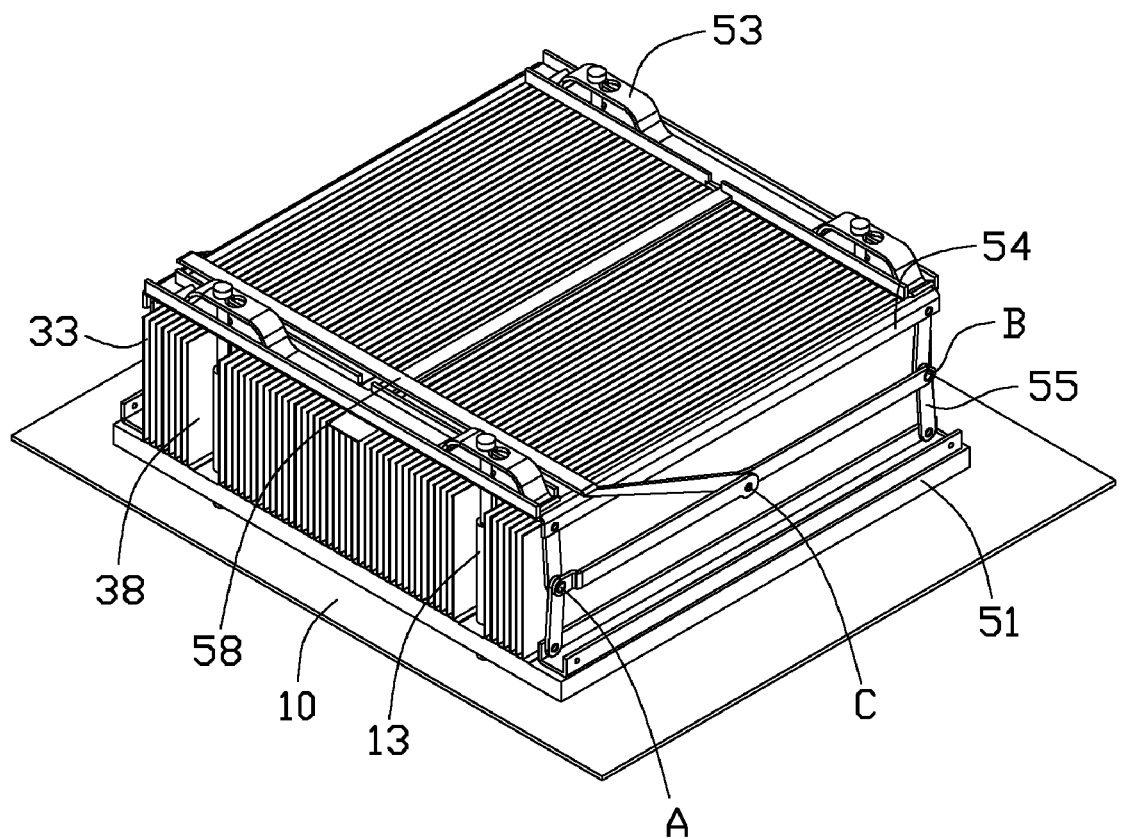
FIG. 2 is similar to FIG. 1, but showing the clip locked.
Figure 3:
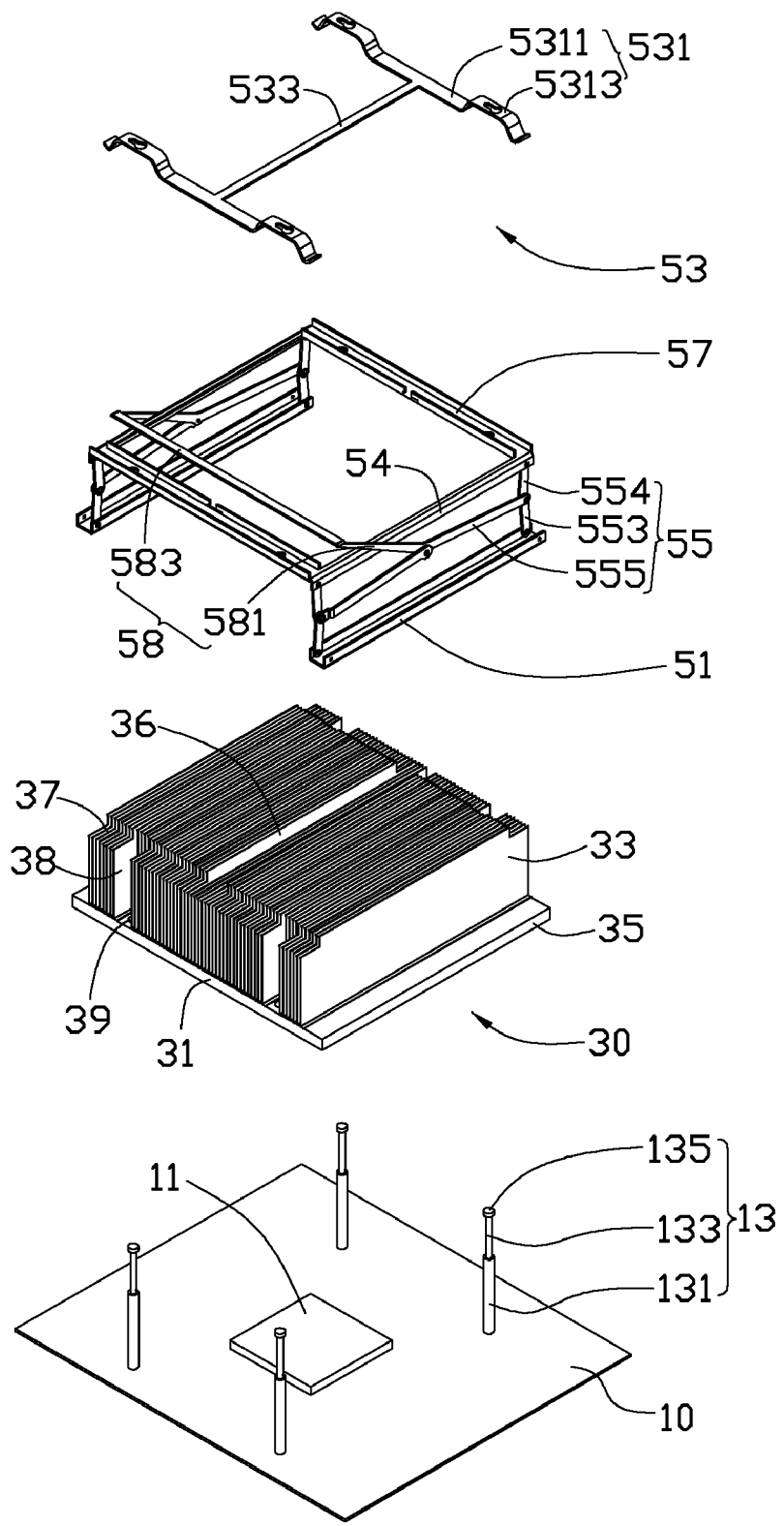
FIG. 3 is an exploded view of the heat sink assembly of FIG. 1.

Referring to FIGS. 1-3, an embodiment of a heat sink assembly is shown. The heat sink assembly comprises a heat sink 30, and a clip 50 engaging with the heat sink 30. The heat sink 10 thermally contacts an electronic component 11 mounted on a printed circuit board (PCB) 10. The clip 50 spans over the heat sink 30 and also extends through the heat sink 30 and engages with four fasteners 13 which are located on four corners of the PCB 10, thereby securing the heat sink 30 on the PCB 10.

Figure 4:
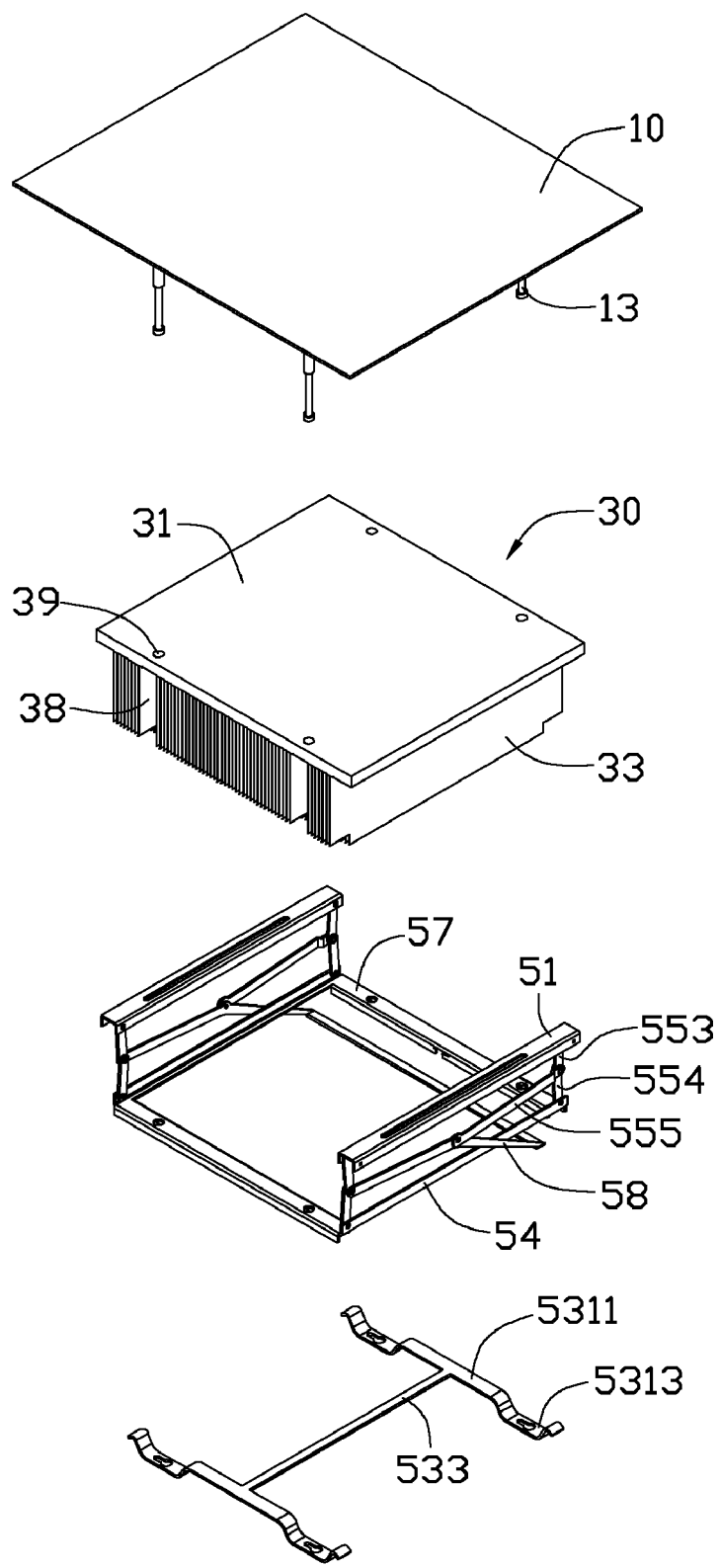
FIG. 4 is an inverted view of FIG. 3.
Figure 5:
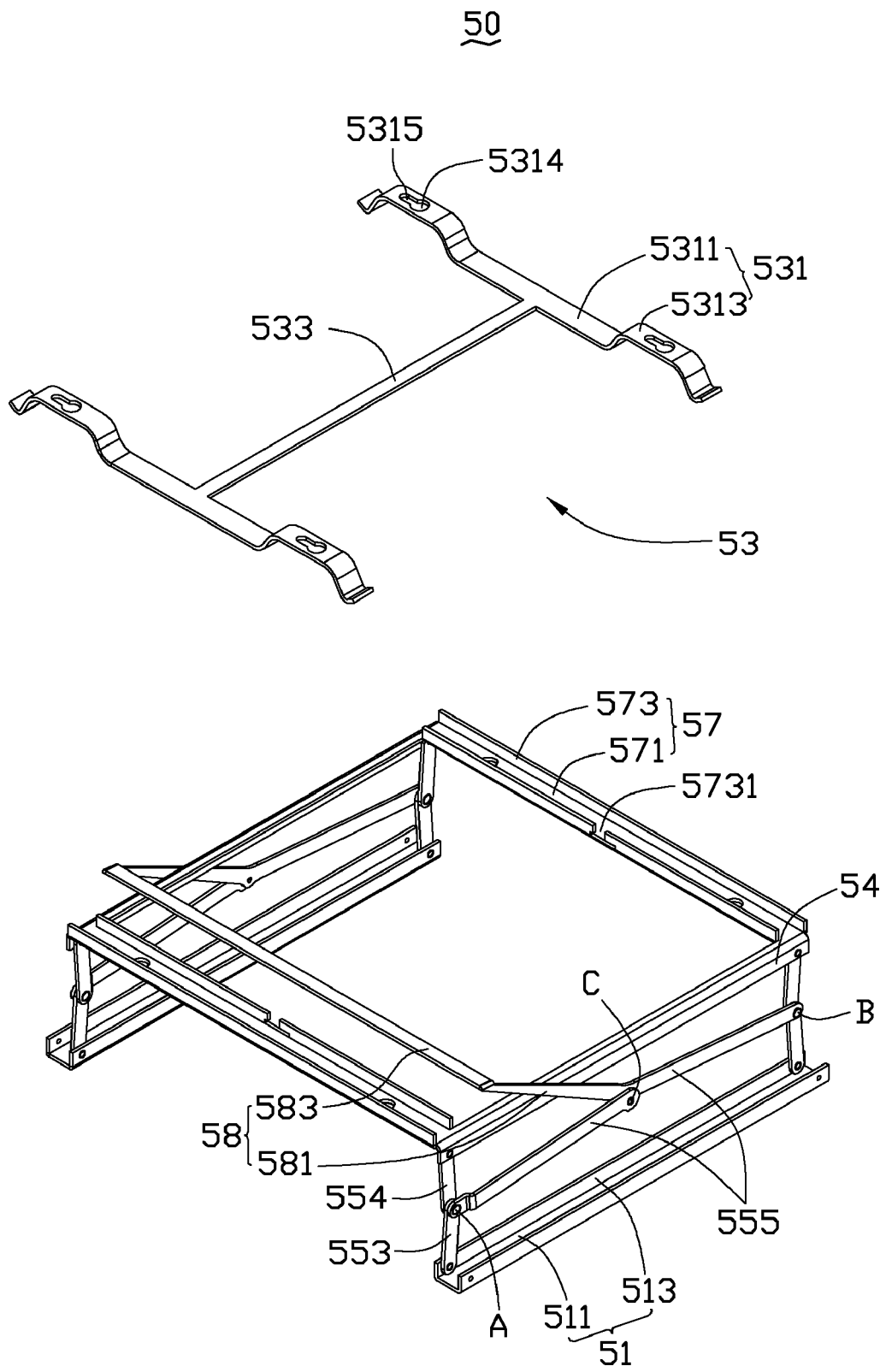
FIG. 5 is an exploded view of the clip of FIG. 1.

Referring to FIGS. 4-5 also, the clip 50 comprises two spaced connecting portions 51, two linking portions 54 located above the two connecting portions 51, two supporting portions 57 interconnected between the two linking portions 54, a pressing portion 53 supported by the supporting portions 57, two operating portions 55 interconnecting corresponding connecting portions 51 and linking portions 54, respectively, and a handle 58 interconnecting the two operating portions 55.

The two connecting portions 51 connect with the heat sink 30. Each of the connecting portions 51 has a U-shaped configuration. Each connecting portion 51 comprises an elongated connecting plate 511 and two elongated extending plates 513 extending perpendicularly and upwardly from lateral sides of the connecting plate 511. The connecting plate 511 connects with the heat sink 30. One of the extending plates 513 pivotally engages with the operating portion 55. The connecting plate 511 is parallel to the corresponding linking portion 54.

Each of the operating portions 55 is a linkage, and comprises two first rods 553, two second rods 554, and two third rods 555. Lower ends of the first rods 553 pivotally engage with front and rear ends of the extending plate 513 of the connecting portion 51, and upper ends of the first rods 553 pivotally engage with lower ends of the second rods 554, respectively. The first and second rods 553, 554 join at a point A and a point B, respectively. Upper ends of the second rods 554 pivotally engage with front and rear ends of the linking portion 54, respectively. The two third rods 555 are generally aligned with each other end-to-end albeit slightly offset from each other. Outer ends of the third rods 555 pivotally engage with the first and second rods 553, 554 at the point A and the point B respectively, and inner ends of the third rods 555 are pivotally joined to each other at a point C.

The handle 58 integrally extends from the inner ends of the two rearmost third rods 555 of the two operating portions 55, slantwise from the points C. Thus movement of the handle 58 directly brings movement of the two rearmost third rods 555. In particular, the handle 58 has a U-shaped configuration, and comprises two connecting arms 581 integrally extending from the two rearmost third rods 555, and an operating arm 583 interconnecting two ends of the connecting arms 581.

The pressing portion 53 is an elastic element. The pressing portion 53 comprises two pressing plates 531, and a joining plate 533 sandwiched between the pressing plates 531 and connecting central portions of the pressing plates 531. Each of the pressing plates 531 comprises an elongated pressing section 5311, and two inverted U-shaped engaging sections 5313 extending outwardly from lateral ends of the pressing section 5311. The joining plate 533 is an elongated sheet and perpendicular connects with central portions of the two pressing sections 5311 of the two pressing plates 531. Each of the engaging sections 5313 defines a first through hole 5314 and a second through hole 5315. The first through hole 5314 communicates with and is aligned with the second through hole 5315. A bore diameter of the first through hole 5314 is larger than that of the second through hole 5315. The fasteners 13 are extended through the first through holes 5314, and are then offset to the second through holes 5315 by pushing the joining plate 533. Thereby, the fasteners 13 are engaged with the pressing portion 53.

Each of the supporting portions 57 comprises an elongated supporting plate 571, and two elongated baffle plates 573 extending perpendicularly and upwardly from front and rear ends of the supporting plate 571. The pressing plate 531 is sandwiched between the two baffle plates 573. An inverted T-shaped groove 5731 is defined in a central portion of an inner one of the baffle plates 573 (which is nearest to the other supporting portion 57). The joining plate 533 is inserted in a side of the groove 5731 and abuts against the baffle plate 573. Thus, the pressing portion 53 is secured on the supporting portion 57.

Referring to FIG. 3 again, each of the fasteners 13 is a metallic pole. Each fastener 13 comprises an extending portion 131 perpendicular connecting with the PCB 10, an engaging portion 133, and a head 135. The engaging portion 133 extends upwardly from a top end of the extending portion 131. The head 135 is located at a top end of the engaging portion 133. The extending portion 131, the engaging portion 133 and the head 135 are cylindrical. A diameter of the engaging portion 133 is smaller than that of the extending portion 131 and the head 135. The diameter of the extending portion 131 approaches that of the head 135. The diameter of the extending portion 131 is smaller the bore diameter of the first through hole 5314 and larger than the bore diameter of the second through hole 5315 of the pressing plate 531.

The heat sink 30 is integrally made of metal with high heat conductivity, such as copper, aluminum or an alloy thereof.

The heat sink 30 comprises a rectangular base 31, and a plurality of fins 33 extending upwardly from a top surface of the base 31. The fins 33 are parallel to and spaced from each other. Two elongated ears 35 extend outwardly from lateral ends of the base 31, to engage with the two connecting portions 51 of the clip 50. Front and rear portions of each fin 33 are shorter than a central portion of the fin 33. Thus, two L-shaped steps 37 are defined at front and rear top ends of the heat sink 30. The two steps 37 support the two supporting portions 57 of the clip 50. A rectangular recess 36 is defined in a central portion of a top end of the heat sink 30, to receive the joining plate 533 of the pressing portion 53 therein. Four receiving spaces 38 are defined near four corners of the heat sink 30. The receiving spaces 38 are provided by certain of the fins 33 which have only central portions and no front or rear portions. The fasteners 13 extend through four through holes 39 of the base 31 and the receiving spaces 38 to engage with the pressing portion 53 of the clip 50.

Referring to FIGS. 1-2 again, when the heat sink assembly is assembled, the two operating portions 55 span over the heat sink 30. The two connecting plates 511 of the two connecting portions 51 are secured on the two ears 35 of the heat sink 30. The two supporting plates 571 of the two supporting portions 57 abut against the steps 37 of the heat sink 30, respectively. The two linking portions 54 are located at opposite lateral sides of the heat sink 30 to sandwich the heat sink 30 therebetween. The pressing portion 53 is located at a top of the heat sink 30. The pressing plates 531 of the pressing portion 53 resiliently press the two supporting plates 571 of the two supporting portions 57, respectively. The joining plate 533 of the pressing portion 53 is received in the recess 36 of the heat sink 30. Opposite ends of the joining plate 533 are received in the grooves 5731 of the baffle plates 573 of the pressing portions 57, respectively. In this state, the clip 50 and the heat sink 30 are assembled together.

Then the heat sink 30 is pushed towards the PCB 10, to make the fasteners 13 of the PCB 10 extend through the through holes 39 and the receiving spaces 38 of the heat sink 30 and the first through holes 5314 of the pressing plates 531 of the pressing portion 53 of the clip 50 in that order. In this state, each head 135 of the fastener 13 is locate above the engaging section 5313 of the corresponding pressing plate 531, and the corresponding engaging portion 133 is received in the corresponding first through hole 5314. The joining plate 533 of the pressing portion 53 is pushed by hand to slightly offset the pressing portion 53 in a direction perpendicular to the joining plate 533. Thus, the engaging portions 133 of the fastener 13 enter the second through holes 5315 of the pressing plate 531. The operating arm 583 is operated to make the front ends of the two rearmost third rods 555 spread frontward and downward, and make rear ends of the two rearmost third rods 555 spread rearward and upward. That is, the two rearmost third rods 555 are reoriented such that they are approximately level. The two rearmost third rods 555 thereby drive the two frontmost third rods 555, which in turn drive the first and second rods 553, 554 to straighten upward to approximately upright orientations, in order to make the supporting portions 57 and the linking portions 54 move upward.

Thus, a distance between each supporting plate 571 of the supporting portion 57 and the head 135 of the corresponding fastener 13 is shortened, and the engaging section 5313 of the corresponding pressing plate 531 of the pressing portion 53 is pressed by the head 135. The engaging section 5313 is elastically deformed and resiliently presses the supporting portion 57. When the point C of each operating portion 55 is located below the point A and the point B, the operating portions 55 are locked. Thereby, the heat sink assembly is completely assembled. In this state, the operating arm 583 of the handle 58 is horizontal and presses the linking portions 54. The two third rods 555 of each operating portion 55 are approximately level and generally collinear with each other.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A clip adapted for securing a heat sink on a printed circuit board (PCB), the clip comprising:
   a linking portion located at a lateral side of the heat sink;
   an operating portion pivotally engaging with the linking portion and the heat sink, respectively;
   a handle connecting with the operating portion;
   a pressing portion connecting with the linking portion; and
   a fastener mounted on the PCB and extending through the heat sink and the pressing portion;
   wherein the pressing portion is slidable from a first position in which the pressing portion is not engageable with the fastener to a second position in which the pressing portion is engageable with the fastener, and when the pressing portion is in the second position the handle is operable to drive the operating portion to move upwardly and urge the pressing portion to move along the fastener until the pressing portion abuts against a top portion of the fastener and simultaneously presses the heat sink.

2. The clip as claimed in claim 1, wherein the pressing portion is substantially in the form of an elastic sheet and is elastically deformed when pressed by the top portion of the fastener.

3. The clip as claimed in claim 1, wherein the fastener comprises an engaging portion and a head located at a top of and larger in diameter than the engaging portion, the engaging portion extends through the pressing portion of the clip, and the head abuts against and presses the pressing portion when the pressing portion has been urged to move along the fastener.

4. The clip as claimed in claim 1, wherein the operating portion is a linkage and comprises two first rods, two second rods and two third rods, lower ends of the first rods pivotally engage with opposite ends of the heat sink and upper ends of the first rods pivotally engage with lower ends of the second rods at a first point and at a second point, upper ends of the second rods pivotally engage with opposite ends of the linking portion, outer ends of the third rods pivotally engage with the first and second rods at the first point and at the second point, inner ends of the third rods pivotally join at a third point, and the handle integrally extends from the inner end of a rearmost one of the third rods, slantwise from the third point.

5. The clip as claimed in claim 4, wherein when the pressing portion abuts against and presses the top portion of the fastener, the operating portion is in a locked position, with the third point below the first point and the second point, and with the third rods approximately level and generally collinear with each other.

6. The clip as claimed in claim 4, further comprising another operating portion and another linking portion, wherein the two operating portions are located at opposite sides of the heat sink, and the two linking portions sandwich the heat sink therebetween.

7. The clip as claimed in claim 6, further comprising another fastener mounted on the PCB and extending through the heat sink and the pressing portion, wherein the pressing portion comprises a pressing plate pressing the heat sink when the pressing portion has been urged to move along the fasteners, the pressing plate comprises an elongated pressing section and two inverted U-shaped engaging sections extending outwardly from opposite ends of the pressing section, and the two fasteners of the PCB extend through the two engaging sections, and top portions of the fasteners press the engaging sections when the pressing portion has been urged to move along the fasteners.

8. The clip as claimed in claim 7, further comprising another two fasteners mounted on the PCB and extending through the heat sink and the pressing portion, wherein the pressing portion further comprises another pressing plate, with the two pressing plates spaced apart from each other, the another pressing plate pressing the heat sink when the pressing portion has been urged to move along the fasteners, and opposite ends of each of the two pressing plates abut against the two linking portions.

9. The clip as claimed in claim 8, further comprising two supporting portions interconnecting the two linking portions, the two pressing plates of the pressing portion pressing the two supporting portions, respectively.

10. The clip as claimed in claim 9, wherein each of the supporting portions comprises a supporting plate and two baffle plates extending upwardly from opposite sides of the supporting plate, and the corresponding pressing plate is sandwiched between the two baffle plates and abuts against the supporting plate.

11. The clip as claimed in claim 10, wherein one of the baffle plates of each supporting portion nearer to a middle of the clip has an inverted T-shaped groove defined therein, the pressing portion further comprises a joining plate interconnecting the two pressing plates, and opposite ends of the joining plate are inserted in the grooves of the baffle plates of the supporting portions and are slidable along the grooves.

12. The clip as claimed in claim 1, further comprising a connecting portion connecting with the heat sink, wherein the operating portion is pivotally engaged with the connecting portion.

13. An electronic component assembly comprising:
a printed circuit board (PCB) having an electronic component, and two fasteners located at diagonally opposite corners of the electronic component;
a heat sink thermally contacting with the electronic component; and
a clip spanning over the heat sink and engaged with the fasteners to mount the heat sink on the PCB, the clip comprising:
two linking portions located at opposite lateral sides of the heat sink and sandwiching the heat sink therebetween;
two operating portions located at the opposite lateral sides of the heat sink and pivotally engaging with the linking portions, respectively;
a handle connecting with the two operating portions; and
an elastic pressing portion connecting with the two linking portions;
wherein the pressing portion is slidable from a first position in which the pressing portion is not engageable with the fastener to a second position in which the pressing portion is engageable with fastener, and when the pressing portion is in the second position the handle is operable to drive the operating portions to move upwardly and urge the pressing portion to move along the fasteners until the pressing portion abuts against a top portion of the fasteners and simultaneously presses the heat sink.

14. The electronic component assembly as claimed in claim 13, wherein the operating portion comprises two first rods, two second rods and two third rods, lower ends of the first rods pivotally engage with opposite ends of the heat sink and upper ends of the first rods pivotally engage with lower ends of the second rods at a first point and at a second point, upper ends of the second rods pivotally engage with opposite ends of the linking portion, outer ends of the third rods pivotally engage with the first and second rods at the first point and the second point, and inner ends of the third rods pivotally join at a third point, and the handle integrally extends from the inner ends of a rearmost one of the third rods, slantwise from the third point.

15. The electronic component assembly as claimed in claim 14, wherein when the pressing portion abuts against and presses the top portion of the fasteners, the operating portion is in a locked position, with the third point is below the first point and the second point, and with the third rods approximately level and generally collinear with each other.

16. The electronic component assembly as claimed in claim 15, further comprising another fastener mounted on the PCB and extending through the heat sink and the pressing portion, wherein the pressing portion comprises two spaced pressing plates pressing the heat sink when the pressing portion has been urged to move along the fasteners, each of the pressing portions comprises an elongated pressing section and two inverted U-shaped engaging sections extending outwardly from opposite ends of the pressing section, and the two fasteners of the PCB extend through the two engaging sections and press the engaging sections when the pressing portion has been urged to move along the fasteners.

17. The electronic component assembly as claimed in claim 16, wherein the clip further comprises two supporting portions interconnecting the two linking portions, the two pressing plates of the pressing portion pressing the two supporting portions, respectively.

18. The electronic component assembly as claimed in claim 17, wherein each of the supporting portions comprises a supporting plate and two baffle plates extending upwardly from opposite sides of the supporting plate, and the corresponding pressing plate is sandwiched between the two baffle plates and abuts against the supporting plate.

19. The electronic component assembly as claimed in claim 18, wherein one of the baffle plates of each supporting portion nearer to a middle of the clip has an inverted T-shaped groove defined therein, the pressing portion further comprises a joining plate interconnecting the two pressing plates, and opposite ends of the joining plate are inserted in the grooves of the baffle plates of the supporting portions and are slidable along the grooves.

* * * * *